United States Patent
Ohno et al.

(10) Patent No.: US 10,343,191 B2
(45) Date of Patent: Jul. 9, 2019

(54) WIPING DEVICE AND STACK MANUFACTURING APPARATUS

(71) Applicant: Semiconductor Energy Laboratory Co., Ltd., Atsugi-shi, Kanagawa-ken (JP)

(72) Inventors: Masakatsu Ohno, Utsunomiya (JP); Kayo Kumakura, Tochigi (JP); Satoru Idojiri, Tochigi (JP); Yoshiharu Hirakata, Tochigi (JP); Kohei Yokoyama, Fujisawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 222 days.

(21) Appl. No.: 15/302,260

(22) PCT Filed: Apr. 13, 2015

(86) PCT No.: PCT/IB2015/052660
§ 371 (c)(1),
(2) Date: Oct. 6, 2016

(87) PCT Pub. No.: WO2015/166363
PCT Pub. Date: Nov. 5, 2015

(65) Prior Publication Data
US 2017/0021394 A1    Jan. 26, 2017

(30) Foreign Application Priority Data
Apr. 30, 2014    (JP) .................................. 2014-093642

(51) Int. Cl.
*B08B 1/00*    (2006.01)
*H01L 21/304*    (2006.01)
(Continued)

(52) U.S. Cl.
CPC ........... *B08B 1/006* (2013.01); *B25J 11/0085* (2013.01); *B25J 15/0206* (2013.01);
(Continued)

(58) Field of Classification Search
CPC ....... B08B 11/00; B08B 1/006; H01L 21/304; H01L 21/02; H01L 27/12;
(Continued)

(56) References Cited

U.S. PATENT DOCUMENTS 8,367,440 B2    2/2013    Takayama et al.
8,415,208 B2    4/2013    Takayama et al.
(Continued)

FOREIGN PATENT DOCUMENTS

CN    001397984 A    2/2003
EP    1988575 A    11/2008
(Continued)

OTHER PUBLICATIONS

Machine translation of JP 2003-71391; Publication year 2003.*
(Continued)

*Primary Examiner* — Vishal I Patel
(74) *Attorney, Agent, or Firm* — Robinson Intellectual Property Law Office; Eric J. Robinson

(57) ABSTRACT

An object is to eliminate a harmful effect when a film is bonded by wiping an adhering sealant (30a). Characterized is a wiping device (200) including a stage (230) that supports a sheet-like member (220), a wiping means (210) that wipes an adhering object (30a) adhering on a peripheral portion of the sheet-like member (220), a wiping cloth (241) that is attachably and detachably provided for the wiping means (210), and a solvent (261) that adheres to the wiping cloth (241), in which the wiping means (210) is provided with the wiping cloth (241), makes the solvent (261) adhere to the wiping cloth (241), and wipes the adhering object (30a), or
(Continued)

a stack manufacturing apparatus (1000) including such a wiping device (200).

12 Claims, 7 Drawing Sheets

(51) Int. Cl.
| | |
|---|---|
| *H01L 21/02* | (2006.01) |
| *H01L 27/12* | (2006.01) |
| *B25J 11/00* | (2006.01) |
| *B32B 37/00* | (2006.01) |
| *B32B 38/18* | (2006.01) |
| *H01L 21/67* | (2006.01) |
| *H01L 21/78* | (2006.01) |
| *B25J 15/02* | (2006.01) |
| *B08B 11/00* | (2006.01) |

(52) U.S. Cl.
CPC .......... *B32B 37/0046* (2013.01); *B32B 38/18* (2013.01); *H01L 21/02* (2013.01); *H01L 21/02096* (2013.01); *H01L 21/304* (2013.01); *H01L 21/67092* (2013.01); *H01L 21/7806* (2013.01); *H01L 27/12* (2013.01); *B08B 11/00* (2013.01)

(58) Field of Classification Search
CPC ......... H01L 21/67092; H01L 21/02096; H01L 21/7806; B32B 38/18; B32B 37/0046; B25J 11/0085; B25J 15/0206
See application file for complete search history.

(56) References Cited

U.S. PATENT DOCUMENTS

| | | | |
|---|---|---|---|
| 8,619,003 | B2 | 12/2013 | Dairiki et al. |
| 8,902,123 | B2 | 12/2014 | Dairiki et al. |
| 9,202,987 | B2 | 12/2015 | Takayama et al. |
| 2003/0032210 | A1 | 2/2003 | Takayama et al. |
| 2016/0079283 | A1 | 3/2016 | Takayama et al. |

FOREIGN PATENT DOCUMENTS

| | | |
|---|---|---|
| JP | 58-028486 A | 2/1983 |
| JP | 09-085187 A | 3/1997 |
| JP | 11-188677 A | 7/1999 |
| JP | 11-320475 A | 11/1999 |
| JP | 2000-237699 A | 9/2000 |
| JP | 2003-053281 A | 2/2003 |
| JP | 2003-071391 A | 3/2003 |
| JP | 2003-142897 A | 5/2003 |
| JP | 2003-174153 A | 6/2003 |
| JP | 2008-270787 A | 11/2008 |
| KR | 2003-0007208 A | 1/2003 |
| KR | 2011-0073176 A | 6/2011 |
| TW | 564471 | 12/2003 |
| WO | WO-2011/078446 | 6/2011 |

OTHER PUBLICATIONS

Tadaaki Nakano; Human translation of JP 11-188677; Publication date: Jul. 13, 1999.*
Higuchi Suyoshi; Machin translation of JP 2003-71391; Publication date: Mar. 11, 2011.*
Written Opinion (Application No. PCT/IB2015/052660) dated Aug. 18, 2015.
International Search Report (Application No. PCT/IB2015/052660) dated Aug. 18, 2015.

* cited by examiner

FIG. 3A1
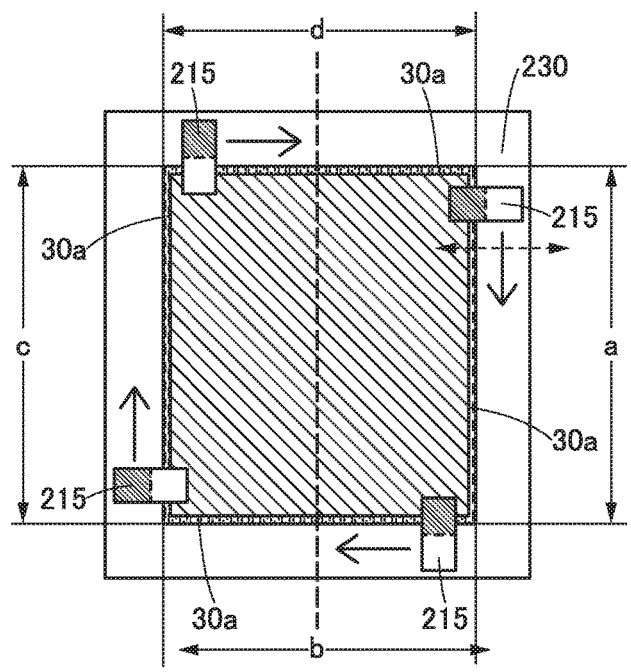
FIG. 3A2
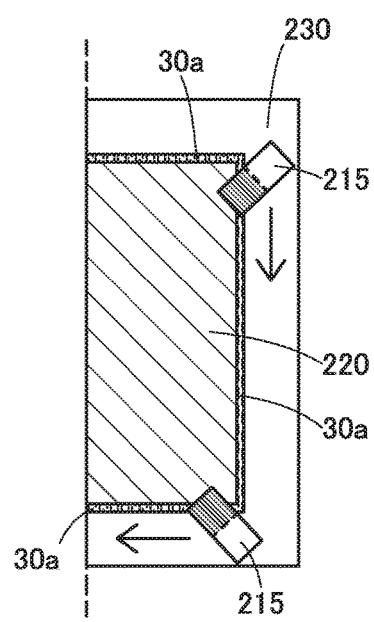
FIG. 3B1
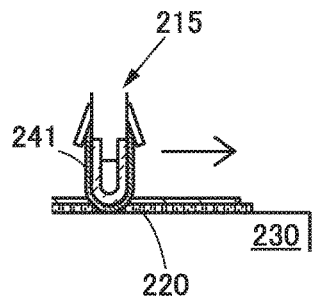
FIG. 3B2
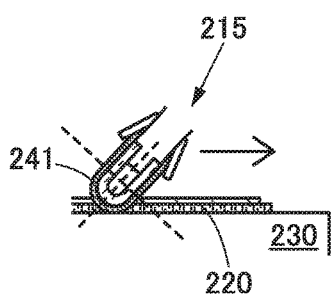
FIG. 3B3
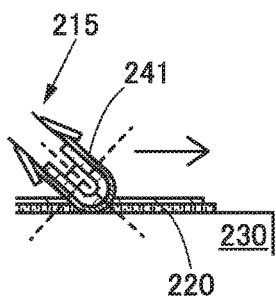
FIG. 3C
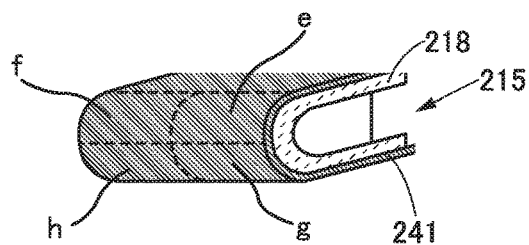

US 10,343,191 B2

WIPING DEVICE AND STACK MANUFACTURING APPARATUS

TECHNICAL FIELD

The present invention relates to, for example, a wiping device for wiping an adhering object that adheres in manufacturing a stack for a semiconductor device, a display device, a light-emitting device, a power storage device, a power generating device, and the like, or a stack manufacturing apparatus.

BACKGROUND ART

In recent years, a flexible device in which a functional element such as a semiconductor element, a display element, or a light-emitting element is provided over a substrate having flexibility (hereinafter also referred to as a flexible substrate) has been developed. Typical examples of the flexible device include a lighting device, an image display device, a variety of semiconductor circuits including a semiconductor element such as a transistor, and the like.

As a method for manufacturing a device using a flexible substrate, a technique has been developed in which a functional element such as a thin film transistor or an organic EL element is formed over a substrate such as a glass substrate or a quartz substrate, and then the functional element is transferred to a flexible substrate. This method needs a separation step of separating, from the substrate, a layer to be separated that includes the functional element.

For example, in a separation technique that is disclosed in Patent Document 1 and uses laser ablation, first, a separation layer including a layer containing tungsten, a layer containing tungsten oxide, and the like is provided over a substrate, a layer to be separated that includes a thin film element is provided over the separation layer, and the layer to be separated is made to adhere to a transfer body with the use of an adhesive layer. Then, the separation layer is ablated by laser light irradiation, so that separation is made to occur in the separation layer.

As a method for manufacturing a light-emitting device using a substrate having flexibility, a technique in which a separation layer is formed over a substrate, e.g., a glass substrate or a quartz substrate, a semiconductor element such as a thin film transistor is formed over the separation layer, and then, the semiconductor element is transferred to another substrate (e.g., a substrate having flexibility) has been developed (see Patent Document 1).

PRIOR ART DOCUMENT

Patent Document

[Patent Document 1] Japanese Published Patent Application No. 2003-174153

SUMMARY OF THE INVENTION

Problems to be Solved by the Invention

Meanwhile, in the case of manufacturing a processed member 90 shown in FIG. 5(A-1), (A-2) and FIG. 7(A-1), (A-2) described below, the following occurs in some cases: when a first substrate 11 (e.g., a glass substrate), a first separation layer 12 existing thereunder and including a layer containing tungsten, a layer containing tungsten oxide, and the like, and a first layer to be separated 13 existing thereunder and including a thin film element in an upper part are pressure-bonded to a second substrate 21 (e.g., a glass substrate), a second separation layer 22 existing thereover and including a layer containing tungsten, a layer containing tungsten oxide, and the like, and a second layer to be separated 23 existing thereover and including a thin film element in a lower part with a bonding layer 30 positioned between them, part of a sealant of the bonding layer 30 flows out and adheres to one or more sides of one to four sides on the peripheral portion of the second substrate 21 and the second layer to be separated 23 in the lower part (see a sealant 30a in a dashed-line region shown in FIG. 5(A-1)).

In such a case, separation of the first substrate 11 and the like in the upper part as shown in FIG. 5(C) causes the sealant to remain on one or more sides of the one to four sides on the peripheral portion of the second substrate 21 and the second layer to be separated 23 in the lower part.

Therefore, when a first adhesive layer 31 is formed in the state over the second substrate 21, the second separation layer 22, and the second layer to be separated 23 (that correspond to a first remaining portion and a sheet-like member) as shown in FIG. 5(D-1), difference in level is made on one or more sides of the one to four sides on the peripheral portion owing to the remaining sealant 30a (for example, see a raised portion 31a shown by a dashed line in FIG. 5(D-1)).

Accordingly, when a film-like first support body 41 is pressure-bonded to a top surface of the first adhesive layer 31 after that with the use of a roller as shown in FIG. 5(E-1), the roller cannot bond the first support body 41 uniformly because of the influence of the difference in level.

An object of the present invention is to eliminate a harmful effect when a first support body is pressure-bonded, by wiping a sealant that is an adhering object. An object is to provide a stack manufacturing apparatus with which a stack including a flexible substrate and a component such as a functional element formed over a substrate can be separated and transferred in a short period of time appropriately. Note that the descriptions of these objects do not disturb the existence of other objects.

Means for Solving the Problems

One embodiment of the present invention is a wiping device including a stage that supports a sheet-like member, a wiping means that wipes an adhering object adhering on a peripheral portion of the sheet-like member, a wiping cloth that is attachably and detachably provided for the wiping means, and a solvent that adheres to the wiping cloth, and the wiping means is provided with the wiping cloth, makes the solvent adhere to the wiping cloth, and wipes the adhering object.

Another embodiment of the present invention is a stack manufacturing apparatus including a first feeding unit that feeds a processed member, a support body feeding unit that feeds a first and a second support bodies, a first isolating unit that isolates a first remaining portion by separating one surface of the processed member, a first cleaning device that cleans the first remaining portion, a first bonding unit that bonds the first support body to the first remaining portion with a first adhesive layer, a first unloader unit that unloads a first stack including the first remaining portion and the first support body bonded with the first adhesive layer, a second feeding unit that feeds the first stack, a starting point formation unit that forms a separation starting point in the vicinity of an end portion of the first remaining portion and the first support body, a second isolating unit that isolates a second remaining portion by separating one surface of the first stack, a second bonding unit that bonds the second support body to the second remaining portion with a second adhesive layer, and a second unloader unit that unloads a second stack including the second remaining portion and the second support body bonded with the second adhesive layer. The first cleaning device includes a stage that supports a sheet-like member that is the first remaining portion, a wiping means that wipes an adhering object adhering on a peripheral portion of the sheet-like member, a wiping cloth that is attachably and detachably provided for the wiping means, and a solvent that adheres to the wiping cloth, in which the wiping means is provided with the wiping cloth, makes the solvent adhere to the wiping cloth, and wipes the adhering object.

Furthermore, the stack can be a stack whose upper and lower surfaces are each provided with a flexible substrate.

Effect of the Invention

With one embodiment of the present invention, when a flexible film is transferred to a sheet-like member or a first remaining portion from which a substrate is separated, the flexible film can be bonded approximately uniformly, and a function of the functional element can be prevented from being degraded.

Furthermore, since the wiping is performed using a solvent, a remaining sealant that is an adhering object can be removed easily. Furthermore, since the wiping cloth is replaced when wiping is performed, the remaining sealant can be removed appropriately. Furthermore, the use of a plurality of surfaces of a wiping cloth can reduce the frequency of wiping cloth replacement, and the processing takt can be improved accordingly.

Furthermore, a flexible stack can be manufactured efficiently in a short period of time using a stack manufacturing apparatus made by collecting various steps of isolating, from bonded upper and lower substrates, one of the substrates to form a first remaining portion, bonding a first flexible substrate to the first remaining portion, isolating the other substrate to form a second remaining portion, and bonding a second flexible substrate to the second remaining portion.

BRIEF DESCRIPTION OF THE DRAWINGS

FIG. 3 Drawings illustrating various wiping actions in the wiping device.
FIG. 7 Drawings illustrating a processed member.

MODE FOR CARRYING OUT THE INVENTION

Figure 1A:
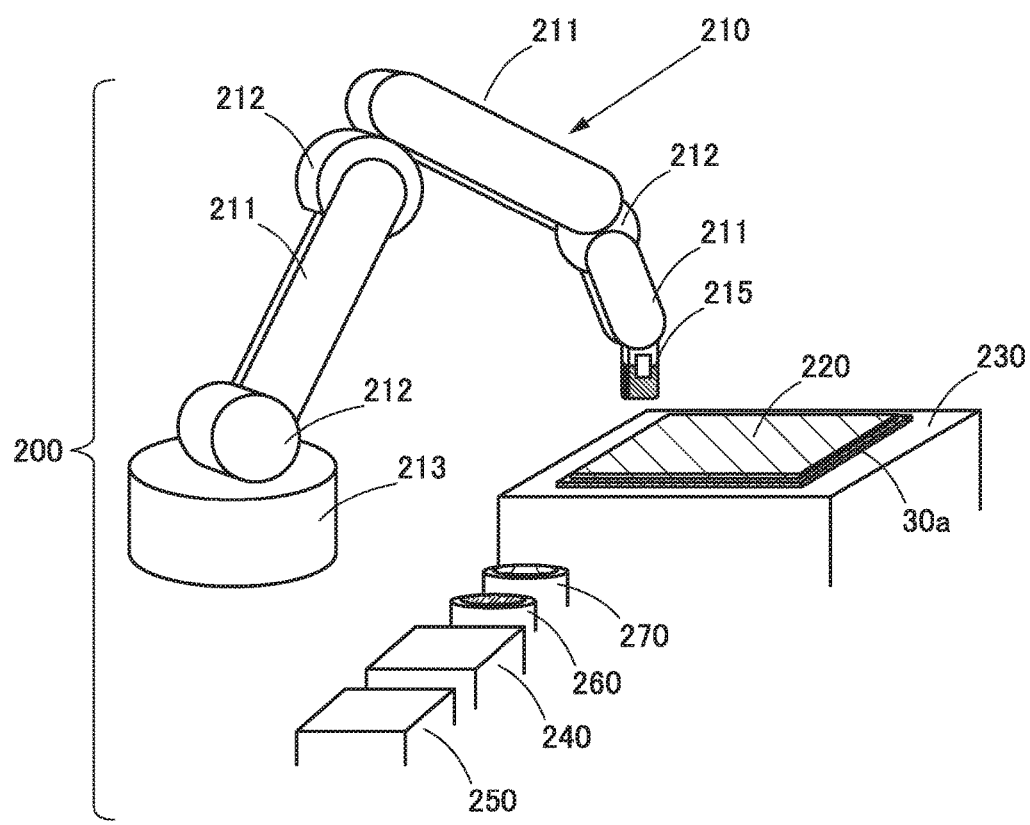
FIG. 1 Drawings illustrating a wiping device.
Figure 1A:
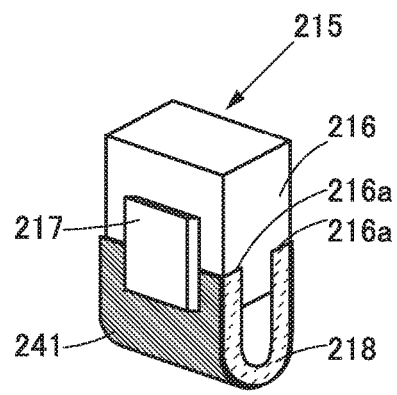
Figure 1A:
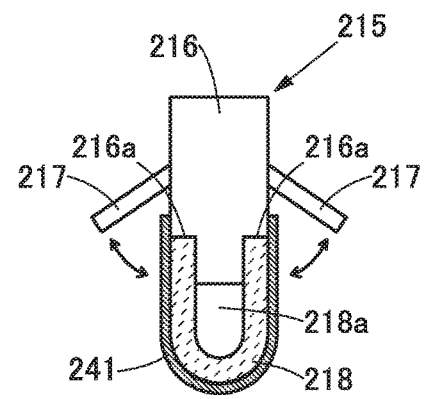

Embodiments will be described in detail with reference to the drawings. Note that the present invention is not limited to the description below, and modes and details thereof can be modified in various ways without departing from the spirit and the scope the present invention. Therefore, the present invention should not be interpreted as being limited to the description of embodiments below. Note that in structures of the invention described below, the same portions or portions having similar functions are denoted by the same reference numerals in different drawings, and description thereof is not repeated in some cases.

Embodiment 1

In this embodiment, a wiping device of one embodiment of the present invention will be described. One embodiment of the present invention can be used in a step before transferring a component including a functional element and the like formed over a substrate to a flexible substrate. For example, it can be used in a step of cleaning a remaining portion (corresponding to a first remaining portion or a sheet-like member) after separating, from a processed member in which the component is provided between upper and lower substrates, one of the substrates. Although it is preferable to use a rigid substrate such as a glass substrate as the substrate, it is also possible to use a flexible substrate of resin or the like.

Figures 1, 5A:
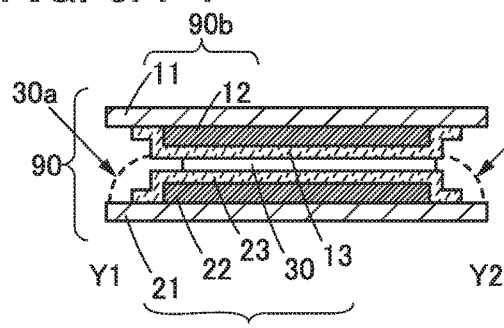
Figures 2, 5A:
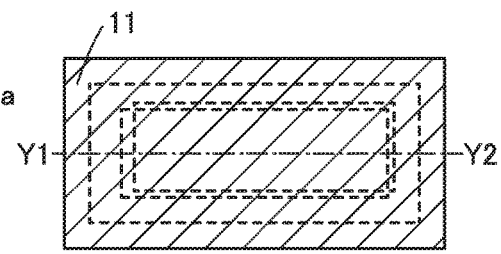
Figures 1, 5B:
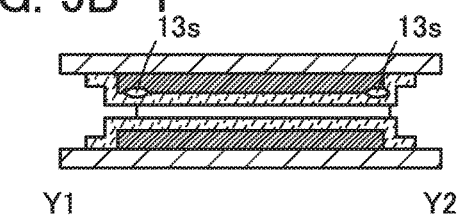
Figures 2, 5B:
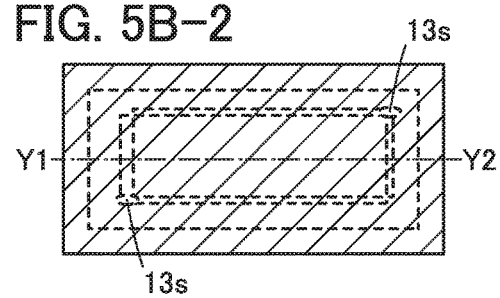

FIG. 1 is a perspective view illustrating the wiping device of one embodiment of the present invention. (A) is a schematic perspective view of the whole thereof, (B1) is a perspective view of a wiping portion at the tip thereof, and (B2) is a cross-sectional view showing a state where a wiping cloth is attached to or detached from the wiping portion. FIG. 2 is a drawing showing a state of attaching a wiping cloth to the wiping portion ((A) to (D)), making a solvent adhere to the wiping cloth ((F)), removing an excess amount of the solvent ((E)), wiping the sealant with the wiping cloth ((G)), and disposing of the wiping cloth ((H)). FIG. 3 is a drawing showing various wiping modes of wiping a sealant with the wiping portion ((A1) to (B3)) and various wiping surfaces of the wiping cloth ((C)).

A wiping device 200 includes a wiping means 210, a sheet-like member 220, a stage 230, a wiping cloth storage container 240 for storing a wiping cloth 241, a wiping cloth disposal container 250 in which the wiping cloth 241 is disposed of, a solvent container 260 for storing a solvent 261, and an excess solvent removal container 270 for removing an excess amount of the solvent 261.

The wiping means 210 is a kind of robot including a plurality of link portions 211, a plurality of joint portions 212, a power portion 213 formed of a motor or the like, and a wiping portion 215 at its tip, and the wiping portion 215 at its tip is driven in various directions rotatably by a control device not shown.

The wiping portion 215 at its tip includes a main body portion 216 and a folded member 218. The main body portion 216 is attached to the tip of the wiping means 210 and includes open and close nails 217 on its right and left side surfaces as shown in FIG. 1(B2); tip portions of the open and close nails 217 are opened and closed in the shape like a Japanese katakana letter "ha" with upper end portions thereof used as pivots. The wiping cloth 241 is clamped in a close state (see FIG. 1(B1)), and the wiping cloth is disposed of in an open state (see FIG. 2(H)). Note that the folded member 218 is an object folded in two, and it is possible to use fluorine-based rubber, a fluorine-based resin, or the like, specifically a perfluoroelastomer.

The folded member 218 is attached to the tip of the main body portion 216. The attachment is performed in such a manner that upper right and upper left end portions of the folded member 218 that is folded into a U-like shape are fitted onto step portions 216a formed in lower external surfaces of the main body portion 216, and portions of contact therebetween are bonded with an adhesive, for example.

As a result, an external surface of the main body portion 216 and an external surface of the folded member 218 are made flush with each other. Furthermore, the folded member 218 takes the shape folded into a U-like shape in its cross section with a hollow portion 218a provided inside. The whole thereof has elasticity; it is deformed by being pressed and returns to its original state, i.e., a state of FIG. 1(B2) when the pressing is canceled. A state where the wiping cloth 241 is clamped is shown in FIG. 1(B1).

The sheet-like member 220 is a rectangular member placed on the stage 230. An example of the sheet-like member 220 is a first remaining portion 90a, such as that shown in FIG. 5 described below, from which the first substrate 11 is separated and in which a component including a functional element and the like is stacked on the second substrate 21 having the sealant 30a remaining as an adhering object on its peripheral surface. The sheet-like member 220 is placed on the stage 230 with a surface provided with the sealant 30a remaining in the vicinity of four sides on the peripheral portion thereof facing upward, and a lower surface thereof is fixed to an upper surface of the stage 230 by a suction means utilizing vacuum that is provided for the stage 230. Note that the sheet-like member 220 is not limited to the above-described object and may be any as long as an adhering object such as the sealant 30a adheres thereon.

Figure 2A:
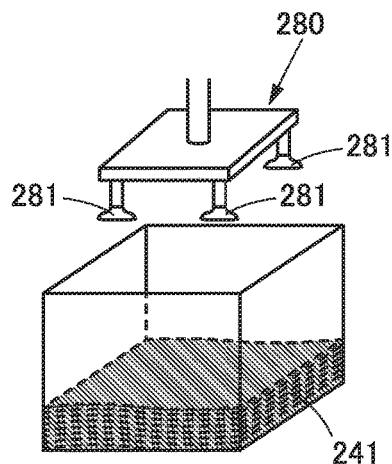
FIG. 2 Drawings illustrating the procedure of wiping with the wiping device.

The wiping cloth storage container 240 is a rectangular container whose upper portion is opened, and a plurality of rectangular wiping cloths 241 made of nonwoven fabric or the like and folded in two are stored inside (see FIG. 2(A)). Note that the container may have any shape.

Figure 2B:
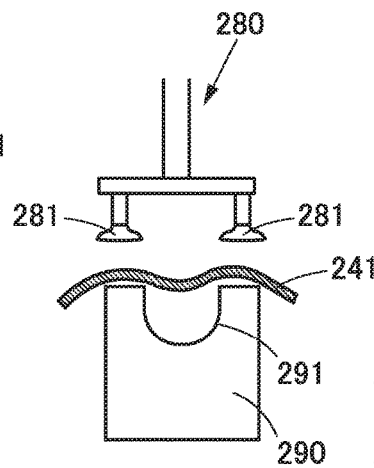
Figure 2C:
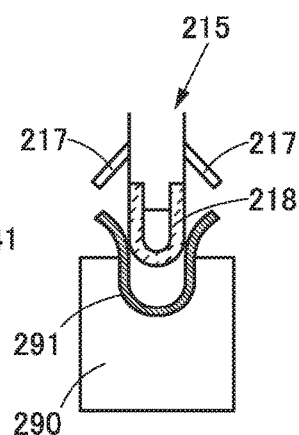
Figure 2D:
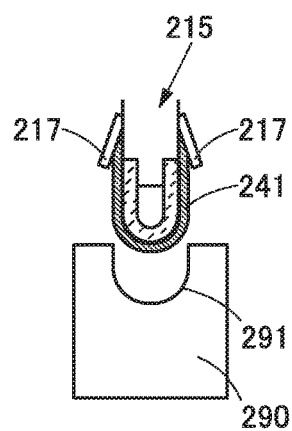
Figure 2E:
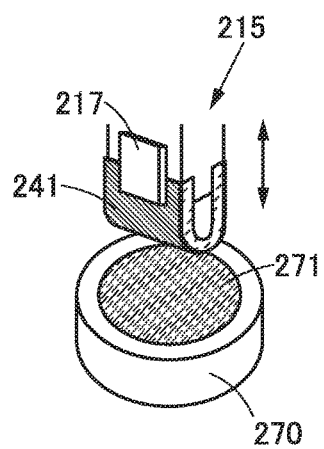
Figure 2F:
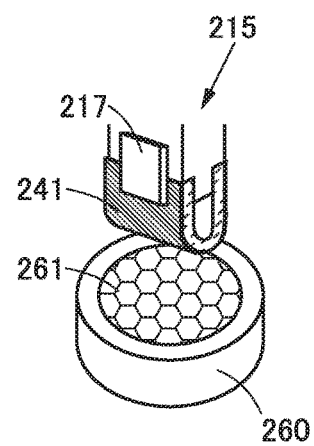
Figure 2G:
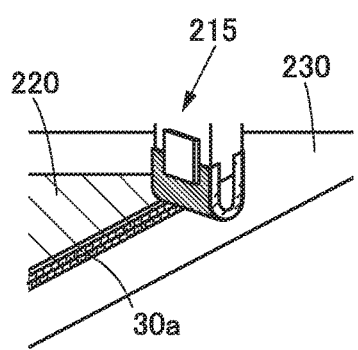
Figure 2H:
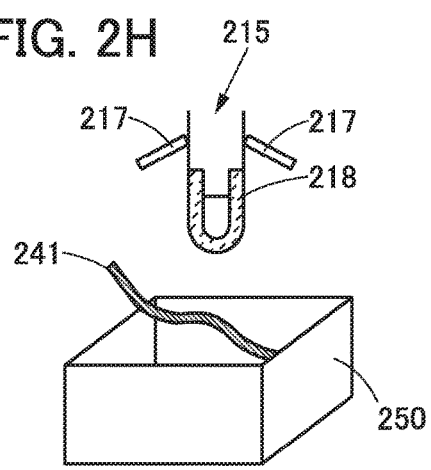

The wiping cloth disposal container 250 is a rectangular container whose upper portion is opened, and the wiping cloth 241 after being used is disposed of therein (see FIG. 2(H)). Note that the container may have any shape.

The solvent container 260 is a circular container whose upper portion is opened, and the solvent 261 is put therein (see FIG. 2(F)). Note that the solvent 261 is, for example, an organic solvent such as acetone and is removed by melting the sealant. Furthermore, the container may have any shape.

The excess solvent removal container 270 is a circular container whose upper portion is opened, and a wire mesh 271 is provided horizontally in a portion of the opening. The wiping portion 215 with the solvent 261 is struck against the wire mesh 271 several times to separate and remove an excess amount of the solvent 261, and the removed solvent 261 is stored in the excess solvent removal container 270 (see FIG. 2(E)). Note that the container may have any shape.

The procedure of a wiping operation is described with reference to FIG. 2. Prepared is a wiping cloth extraction means 280 from which a plurality of suction members 281 utilizing vacuum hang down. The wiping cloth extraction means 280 is moved to a position above the wiping cloth storage container 240, and an uppermost wiping cloth 241 therein is extracted by being sucked with the suction members 281 (see FIG. 2(A)).

Then, the wiping cloth extraction means 280 is moved to a position above a wiping cloth mount 290, and the wiping cloth 241 is dropped onto a top surface of the wiping cloth mount 290 by canceling the vacuum in the suction members 281. A U-like-shaped opening 291 is provided in the top surface of the wiping cloth mount 290, and the wiping cloth 241 lies along an upper portion of the U-like-shaped opening 291 (see FIG. 2(B)).

Then, the wiping portion 215 is moved to a position above the wiping cloth mount 290 and moved downward, whereby the folded member 218 of the wiping portion 215 is inserted into the U-like-shaped opening 291 along with the wiping cloth 241. At this time, the open and close nails 217 are in an open state (see FIG. 2(C)).

Then, the wiping portion 215 is completely inserted into the U-like-shaped opening 291. This makes the wiping cloth 241 have a U-like shape along the folded member 218, and accordingly, the open and close nails 217 are closed to clamp end portions of the wiping cloth 241. After that, the wiping portion 215 is moved upward (see FIG. 2(D)).

Then, the wiping portion 215 is moved to a position above the solvent container 260 and moved downward to make the solvent 261 therein adhere to the wiping cloth 241 (see FIG. 2(F)).

Then, the wiping portion 215 is moved to a position above the excess solvent removal container 270 and moved downward, and the wiping cloth 241 with the solvent 261 is struck against the wire mesh 271 to remove an excess amount of the solvent 261. The amount of solvent necessary for one wiping action, an adhesion amount that adheres in a single adhesion action, and an amount that can be separated with predetermined pressing force applied at a time are obtained in advance. The number of times that the wiping cloth 241 would strike against the wire mesh 271 is obtained from the amounts, and striking is repeated the number of times obtained in directions indicated by an arrow shown in the drawing (see FIG. 2(E)).

Then, the wiping portion 215 is moved to a position above the sealant 30a of the sheet-like member 220 and moved downward, and wiping is performed with the wiping cloth 241 in any of the various wiping modes shown in FIG. 3 (see FIG. 2(G)). Note that the wiping is performed with predetermined pressure applied. In this case, the folded member 218 is slightly deformed owing to its elasticity, and the area of the wiping cloth 241 contacting the sealant 30a is increased accordingly; thus, smooth movement is achieved and a removal effect is improved.

Then, the wiping portion 215 is moved to a position above the wiping cloth disposal container 250, and the wiping cloth 241 after being used is disposed of in the wiping cloth disposal container 250 by releasing the open and close nails 217 (see FIG. 2(H)).

Note that while these steps are performed, the steps of FIG. 2(A), (B) in a next process are already performed. After the step of FIG. 2(H) is finished, the wiping portion 215 performs the step of FIG. 2(C), i.e., another wiping cloth 241 is clamped to wipe the sealant 30a in a next wiping region. Accordingly, time for attaching the wiping cloth 241 can be shortened.

The wiping modes are described using FIG. 3. The roots of solid arrows shown in FIG. 3(A1) to (B3) are each referred to as a front side, and the directions thereof are each referred to as a front direction. The tips of the solid arrows are each referred to as a back side, and the directions thereof are each referred to as a back direction. The sides shown by a dashed arrow (see FIG. 3(A1)) substantially orthogonal to the solid arrow are referred to as left and right sides, and the directions thereof are referred to as left and right directions. Note that the wiping cloth 241 is moved in the front directions from a side a to a side d through a side b and a side c indicated by the solid arrows to wipe the sealant 30a.

Furthermore, after the sealant 30a in a predetermined region is wiped with a predetermined wiping surface of the wiping cloth 241 of the wiping portion 215, the sealant 30a in another region is not wiped by the same wiping surface.

In that case, the predetermined region is determined in advance in accordance with a remaining amount of the sealant 30a. When the remaining amount is large, the predetermined region is any one of the sides a, b, c, and d shown in FIG. 3(A1), for example. When the remaining amount is small, the predetermined region is the four sides a to d, the two sides a and b, or the two sides c and d shown in FIG. 3(A1), for example.

(1) Example of One Wiping Action

In this example, after the sealant 30a in a predetermined region is wiped with a predetermined wiping surface of the wiping cloth 241, the wiping cloth 241 is disposed of. In the case of this example, as mainly shown in FIG. 3(B1), wiping is performed with the same wiping cloth 241 located in a lower end region of the wiping portion 215 with the wiping portion 215 set substantially orthogonal to and substantially perpendicular to the sealant 30a.

Therefore, the width in the left and right directions of the wiping cloth 241 is substantially half that shown in FIG. 3(C); however, for example, in the case where a region to be wiped with the wiping cloth 241 is any one of the sides a, b, c, and d, four cloths are necessary and it takes replacement time accordingly. Note that the wiping portion 215 is rotated 90° every time the wiping of one side is finished, and the same applies to all of the following cases.

(2) Example of Two Wiping Actions

In this example, as shown in FIG. 3(A1), first, the sealant 30a in a predetermined region, e.g., on the sides a and b, is wiped with a wiping surface on the left side (shaded region) (corresponding to the same wiping surface) of the wiping cloth 241, and then, the wiping portion 215 is moved to the right side, and after the sealant 30a in another predetermined region, e.g., on the sides c and d, is wiped with a wiping surface on the right side (white region) (corresponding to another wiping surface) of the wiping cloth 241, the wiping cloth 241 is disposed of.

Therefore, the width in the left and right directions of the wiping cloth 241 is substantially twice the case of the above-described one wiping action as that shown in FIG. 3(C); however, the replacement time is reduced half and the processing takt is improved, whereby the productivity is improved. Note that in the case of this example, as mainly shown in FIG. 3(B1), wiping is performed with the wiping cloth 241 located in the lower end region of the wiping portion 215 with the wiping portion 215 set substantially orthogonal to and substantially perpendicular to the sealant 30a.

(3) Example of Four Wiping Actions

In this example, as shown in FIG. 3(C), a wiping surface of the wiping cloth 241 is divided into a front right surface e (corresponding to a surface on the front side and the right side), a front left surface f (corresponding to a surface on the front side and the left side), a back right surface g (corresponding to a surface on the back side and the right side), and a back left surface h (corresponding to a surface on the back side and the left side). The wiping portion 215 is moved to the front right side, and first, the sealant 30a in a predetermined region, e.g., on the side a, is wiped with the front right surface e of the wiping cloth 241. The wiping portion 215 is moved to the front left side, and the sealant 30a in another predetermined region, e.g., on the side b, is wiped with the front left surface f of the wiping cloth 241. The wiping portion 215 is moved to the back right side, and the sealant 30a in another predetermined region, e.g., on the side c, is wiped with the back right surface g of the wiping cloth 241. The wiping portion 215 is moved to the back left side, and the sealant 30a in another predetermined region, e.g., on the side d, is wiped with the back left surface h of the wiping cloth 241. After that, the wiping cloth 241 is disposed of.

Therefore, as compared with the case of the above-described two wiping actions, the replacement time is reduced half, the processing takt is further improved, and the productivity is further improved. Note that in the case of this example, the wiping portion 215 is used while being inclined to the front as shown in FIG. 3(B2) when the front right surface e and the front left surface f of the wiping cloth 241 are used, and the wiping portion 215 is used while being inclined to the back as shown in FIG. 3(B3) when the back right surface g and the back left surface h of the wiping cloth 241 are used. Furthermore, the movement in the left and right directions is the same as that in the case of the above-described two wiping actions.

(4) Example of a Plurality of Wiping Actions

Although not shown, for example, the case of three wiping actions can be achieved by utilizing the three wiping surfaces of the case of the example of four wiping actions. Furthermore, by providing more than two regions on the left and right, i.e., three or more regions, as regions on the left and right sides of the wiping cloth 241, a plurality of wiping actions can be achieved.

(5) Example of Oblique Wiping

In this example, as shown in FIG. 3(A2), a predetermined region is wiped with the wiping cloth 241 inclined, and then, the wiping cloth 241 is disposed of Specifically, a wiping surface of the wiping cloth 241 straddles the sealant 30a from an inside to an outside and is inclined such that an inner side (the shaded region side) precedes an outer side (the white region side).

When the sealant 30a is wiped in such a mode, the sealant 30a and the like that are wiped off are scraped to the outside, which can reduce a harmful effect of the entry of the sealant 30a and the like into the sheet-like member 220 that would adversely affect the functional element and the like. Note that this example is applicable to any of the above-described examples (1) to (4).

In the case where a flexible film (corresponding to the first support body) is bonded onto a component including a functional element and the like and a substrate with an adhesive layer therebetween, the flexible film can be bonded more uniformly by using the wiping device of one embodiment of the present invention as above.

Note that this embodiment can be combined with the other embodiments in this specification as appropriate.

Embodiment 2

In this embodiment, a stack manufacturing apparatus including the wiping device described in Embodiment 1 is described. Note that there is no limitation on the usage of the manufacturing apparatus. It is useful to use the manufacturing apparatus in a manufacturing process of, in particular, a semiconductor device, a display device, a light-emitting device, a power storage device, a power generating device, or the like with a flexible substrate.

Figure 4:
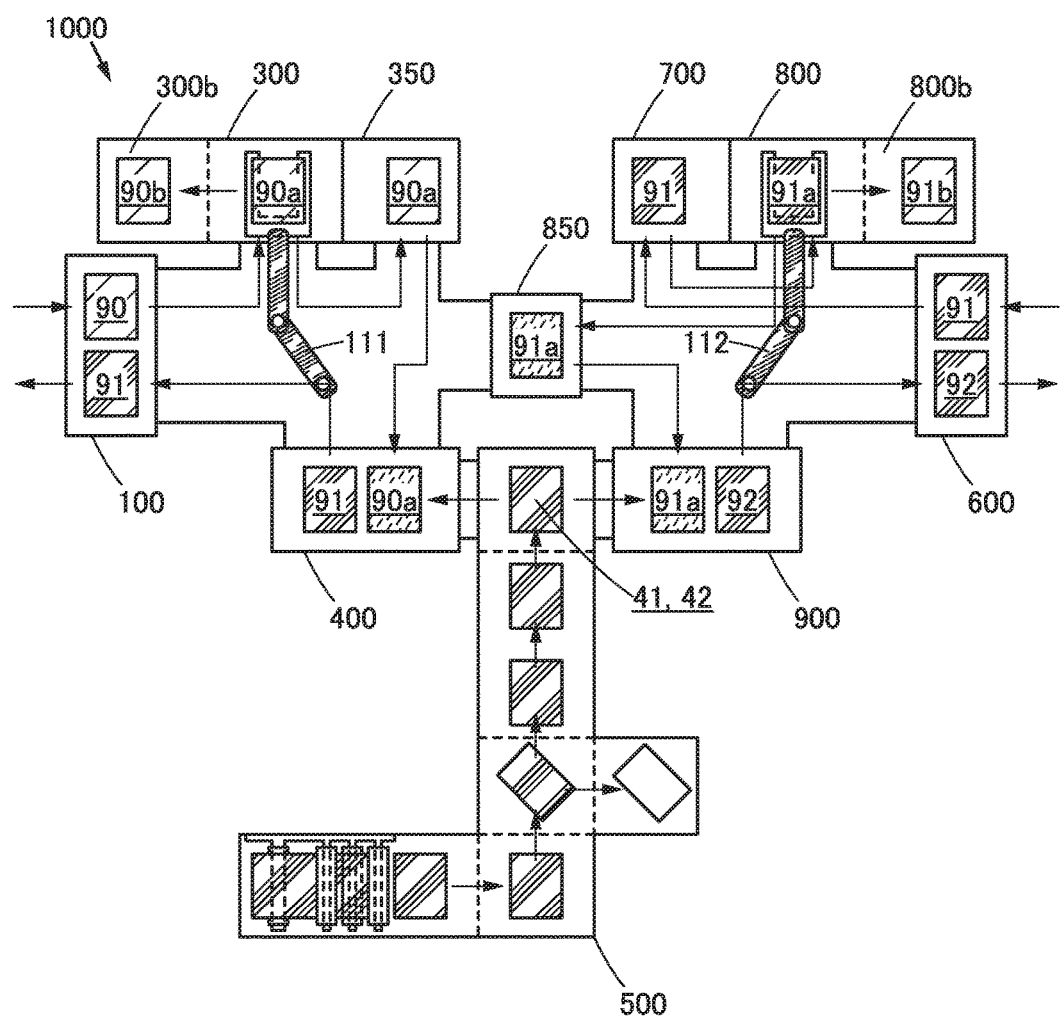
FIG. 4 A drawing illustrating a structure of a stack manufacturing apparatus.

FIG. 4 is a schematic view illustrating a structure of a stack manufacturing apparatus 1000 of one embodiment of the present invention, and the conveyance path of a processed member and a stack in a process.

FIG. 5 and FIG. 6 show schematic views illustrating a process for manufacturing a stack with the use of the stack manufacturing apparatus 1000 of one embodiment of the present invention. Cross-sectional views showing structures of a processed member and a stack are shown in FIG.

Figure 5C:
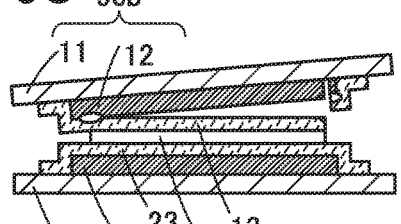
FIG. 5 Drawings illustrating a stack manufacturing process.
Figures 1, 5D:
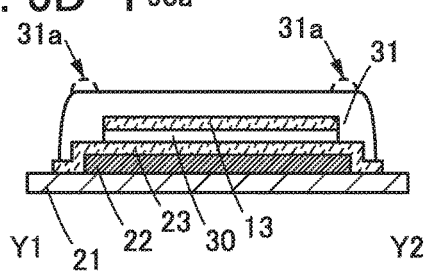
Figures 2, 5D:
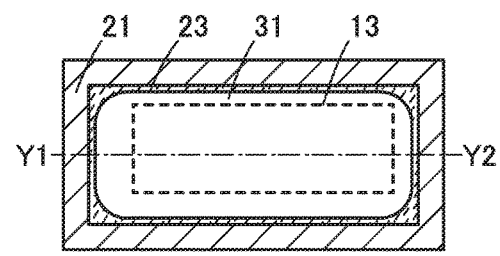
Figures 1, 5E:
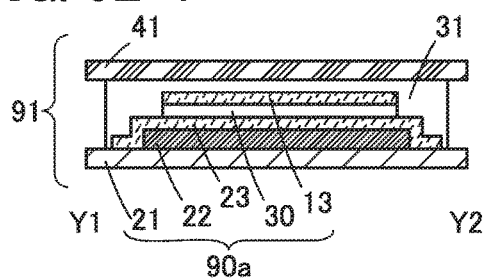
Figures 2, 5E:
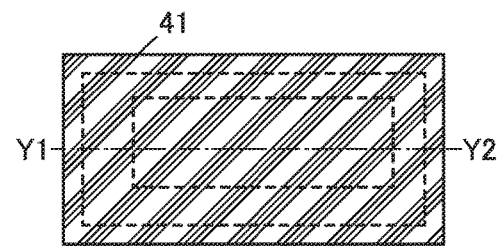
Figures 1, 6A:
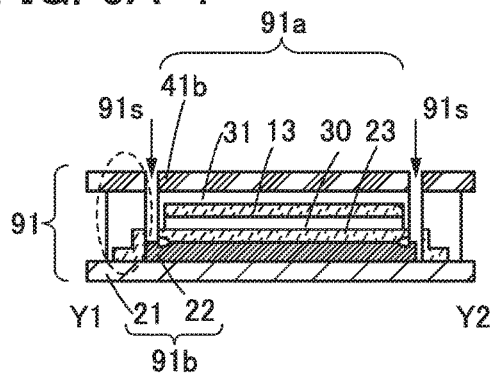
Figures 2, 6A:
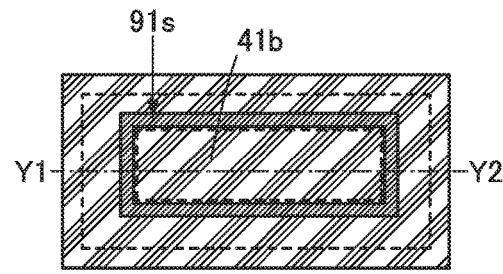
Figure 6B:
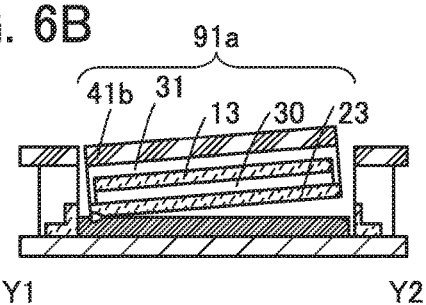
FIG. 6 Drawings illustrating the stack manufacturing process.
Figure 6C:
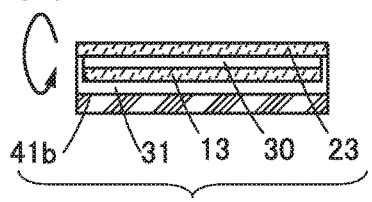
Figures 1, 6D:
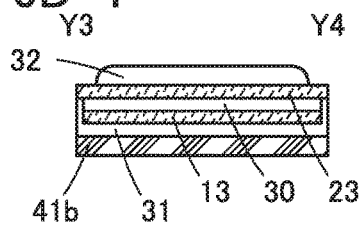
Figures 2, 6D:
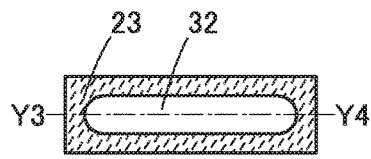
Figures 1, 6E:
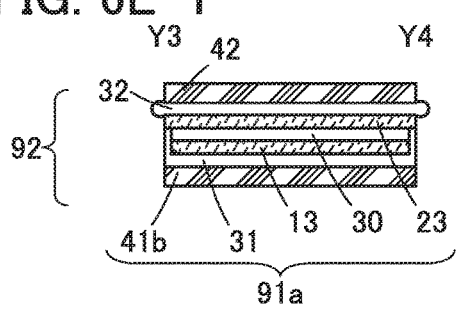
Figures 2, 6E:
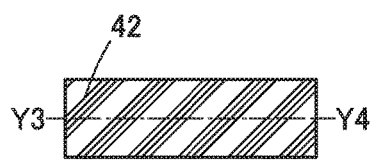

5(A-1), FIG. 5(B-1), FIG. 5(C), FIG. 5(D-1), FIG. 5(E-1), FIG. 6(A-1), FIG. 6(B), FIG. 6(C), FIG. 6(D-1), FIG. 6(E-1), and top views corresponding thereto are shown in FIG. 5(A-2), FIG. 5(B-2), FIG. 5(D-2), FIG. 5(E-2), FIG. 6(A-2), FIG. 6(D-2), FIG. 6(E-2) excluding FIG. 5(C), FIG. 6(B), and FIG. 6(C).

The stack manufacturing apparatus 1000 described in this embodiment includes a first feeding unit 100, a first isolating unit 300, a first cleaning device 350, a first bonding unit 400, a support body feeding unit 500, a second feeding unit 600, a starting point formation unit 700, a second isolating unit 800, and a second bonding unit 900. Note that each unit is named freely, and the name does not limit the function of each unit.

The following describes individual components included in the stack manufacturing apparatus of one embodiment of the present invention.

<<First Feeding Unit>>

Figures 1, 7A:
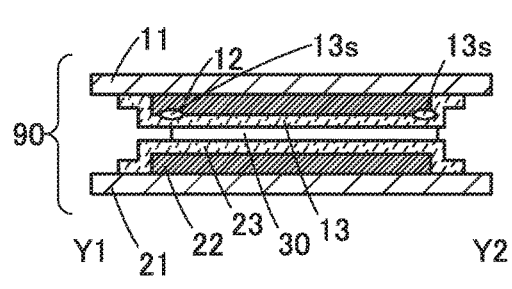
Figures 2, 7A:
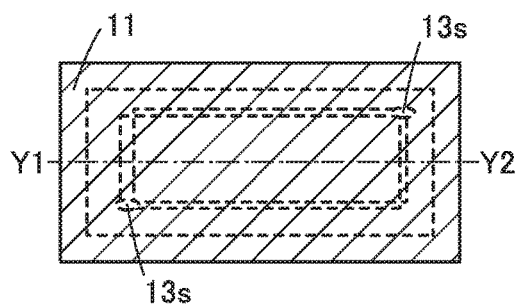

The first feeding unit 100 feeds the processed member 90 (see FIG. 5(A-1) and FIG. 7(A-1), (A-2)). For example, the first feeding unit 100 can include a multistage storage capable of storing a plurality of processed members 90 to allow a conveying means 111 to convey the processed members 90 successively.

Furthermore, the first feeding unit 100 described in this embodiment also serves as a first unloader unit. The first feeding unit 100 unloads a stack 91 (corresponding to a first stack) (see FIG. 5(E-1)) including the first remaining portion 90a, the first adhesive layer 31, and the first support body 41 bonded with the first adhesive layer 31. For example, the first feeding unit 100 can include a multistage storage capable of storing a plurality of stacks 91 to allow the conveying means 111 to convey the stacks 91 successively.

<<First Isolating Unit>>

The first isolating unit 300 includes a means of sucking one surface of the processed member 90 and a means of sucking the other surface facing the one surface. Each of the suction means is pulled away, whereby the one surface of the processed member 90 is separated to isolate the first remaining portion 90a (see FIG. 4 and FIG. 5(A-1) to FIG. 5(C)).

<<First Cleaning Device>>

The first cleaning device 350 removes a sealant remaining on any one or more sides (e.g., two to four sides) of one to four sides on the peripheral portion of the first remaining portion 90a by the wiping device described in Embodiment 1. Note that this step corresponds to one embodiment of the present invention. For the detailed description thereon, Embodiment 1 can be referred to.

<<First Bonding Unit>>

The first bonding unit 400 includes a means of forming the first adhesive layer 31 and a pressure-bonding means of bonding the first remaining portion 90a and the first support body 41 to each other with the use of the first adhesive layer 31 (see FIG. 4 and FIG. 5(D-1) to FIG. 5(E-2)).

Examples of the means of forming the first adhesive layer 31 include a dispenser for applying a liquid adhesive and a device feeding an adhesive sheet shaped as a sheet in advance.

Note that the first adhesive layer 31 may be formed on the first remaining portion 90a and/or the first support body 41. Specifically, a method of using the first support body 41 on which the first adhesive layer 31 is formed in advance may be used. Furthermore, although proper control is made to prevent a material of the first adhesive layer 31 from being squeezed out and adhering to a peripheral surface of the substrate and the first support body 41, in the case where it is squeezed out, it can be wiped using an organic solvent such as acetone, a cloth, or the like.

Examples of the pressure-bonding means of bonding the first remaining portion 90a to the first support body include pressure-applying means such as a pair of rollers, a flat plate and a roller, and a pair of facing flat plates that are controlled to provide a constant pressure or a uniform gap.

<<Support Body Feeding Unit>>

The support body feeding unit 500 feeds the first support body 41. For example, a film which is fed in a rolled shape is unrolled and cut to a predetermined length, a surface of the film is activated by UV or the like, and the film is fed as the first support body 41.

<<Second Feeding Unit>>

The second feeding unit 600 can feed the stack 91. Note that the second feeding unit 600 can also serve as a second unloader unit, and the same structure as the first feeding unit can be used for the second feeding unit 600. That is, a stack 92 (corresponding to a second stack) including a second remaining portion 91a and a second support body 42 bonded to each other with a second adhesive layer 32 is unloaded (see FIG. 4 and FIG. 6(E-1), (E-2)).

<<Starting Point Formation Unit>>

The starting point formation unit 700 forms a separation starting point 91s in the vicinity of end portions of the first remaining portion 90a and a first support body 41b in the stack 91 (see FIG. 6(A-1) and FIG. 6(A-2)). A cutting means of cutting the first support body 41 and the first adhesive layer 31 and separating part of the second layer to be separated 23 from the second separation layer 22 is included, for example.

Specifically, the cutting means includes one or a plurality of blades which have a sharp tip, and relatively moves the blade to the stack 91.

<<Second Isolating Unit>>

The second isolating unit 800 separates one surface 91b of the stack 91 to isolate the second remaining portion 91a (see FIG. 6(B)). To achieve this, a means of sucking the one surface of the stack 91 and a means of sucking the other surface facing the one surface are provided. The two suction means are pulled away, whereby the one surface of the stack 91 is separated to isolate the second remaining portion 91a.

<<Second Bonding Unit>>

The second bonding unit 900 includes a means of forming the second adhesive layer 32 and a pressure-bonding means of bonding the second remaining portion 91a and the second support body 42 to each other with the use of the second adhesive layer 32. That is, the second support body 42 is fed, and the second support body 42 is bonded to the second remaining portion 91a with the use of the second adhesive layer 32 (see FIG. 6(D-1) to FIG. 6(E-2)).

The means of forming the second adhesive layer 32 can have a structure similar to that of the first bonding unit 400, for example.

Note that the second adhesive layer 32 may be formed on the second remaining portion 91a and/or the second support body 42. Specifically, a method of using the second support body 42 on which the second adhesive layer 32 is formed in advance may be used.

The pressure-bonding means of bonding the second remaining portion 91a and the second support body 42 to each other can have a structure similar to that of the first bonding unit 400, for example.

As described above, the stack manufacturing apparatus includes "the first feeding unit 100 that feeds the processed member 90, unloads the stack 91 including the first remaining portion 90a and the first support body 41 bonded to each other with the first adhesive layer 31, and also serves as an unloader unit", "the first isolating unit 300 that isolates the first remaining portion 90a", "the first cleaning device 350 that wipes the remaining sealant", "the first bonding unit 400 that bonds the first support body 41 to the first remaining portion 90a", "the support body feeding unit 500 that feeds the first support body 41 and the second support body 42", "the second feeding unit 600 that feeds the stack 91 and unloads the stack 92 including the second remaining portion 91a, the second adhesive layer 32, and the second support body 42 bonded with the second adhesive layer 32", "the starting point formation unit 700 that forms the separation starting point", "the second isolating unit 800 that isolates the second remaining portion 91a", and "the second bonding unit 900 that bonds the second support body 42 to the second remaining portion 91a".

With these structures, both of the surfaces of the processed member 90 can be separated, the second remaining portion 91a can be isolated, and the first support body 41 and the second support body 42 can be bonded to it. As a result, an apparatus for manufacturing a stack including a support body and a remaining portion of a processed member can be provided.

Furthermore, the stack manufacturing apparatus 1000 described in this embodiment includes a first storage portion 300b, a second storage portion 800b, a second cleaning device 850, the conveying means 111, a conveying means 112, and the like.

Furthermore, the first storage portion 300b stores one surface 90b separated from the processed member 90; the second storage portion 800b stores the one surface 91b separated from the stack 91; the second cleaning device 850 cleans the second remaining portion 91a isolated from the stack 91; the conveying means 111 conveys the processed member 90, the first remaining portion 90a isolated from the processed member 90, and the stack 91; and the conveying means 112 conveys the stack 91, the second remaining portion 91a isolated from the stack 91, and the stack 92. In this manner, the devices are collected, and the processed member and the like are transferred by the two conveying devices, whereby the whole manufacturing apparatus can be downsized, the production time can be shortened, and the production cost can be reduced.

Next, a method for manufacturing the stack 92 from the processed member 90 with the use of the stack manufacturing apparatus 1000 is described below with reference to FIG. 4 to FIG. 6.

The processed member 90 includes the first substrate 11 that is made of glass or the like; the first separation layer 12 that is on the first substrate 11 and includes a layer containing tungsten, a layer containing tungsten oxide, and the like; the first layer to be separated 13 that includes one surface in contact with the first separation layer 12 and includes a functional element and the like; the bonding layer 30 that includes one surface in contact with the other surface of the first layer to be separated 13; the second layer to be separated 23 that includes one surface in contact with the other surface of the bonding layer 30 and includes a functional element and the like; the second separation layer 22 that includes one surface in contact with the other surface of the second layer to be separated 23 and includes a layer containing tungsten, a layer containing tungsten oxide, and the like; and the second substrate 21 that is on the second separation layer 22 and made of glass or the like (see FIG. 5(A-1), (A-2)).

Note that the sealant 30a in FIG. 5(A-1) shows a part of the bonding layer 30 that is squeezed out in pressure-bonding. One embodiment of the present invention wipes the sealant 30a that is thus squeezed out and remains on the first remaining portion 90a. Furthermore, the raised portion 31a shown in FIG. 5(D-1) is a portion that is raised owing to the remaining sealant 30a when the first adhesive layer 31 is formed over the first remaining portion 90a. The raised portion 31a can be eliminated by implementing one embodiment of the present invention.

In this embodiment, description is given of the case of using the processed member 90 in which the separation starting points 13s are formed in advance in the vicinity of end portions of the bonding layer 30 (see FIG. 5(B-1), (B-2)). Furthermore, a structure of the processed member 90 is described in detail in Embodiment 3.

<<First Step>>

The processed member 90 is loaded into the first feeding unit 100. The first feeding unit 100 feeds the processed member 90, and the conveying means 111 conveys and feeds the processed member 90 to the first isolating unit 300.

<<Second Step>>

The first isolating unit 300 separates the one surface 90b of the processed member 90. Specifically, from the separation starting points 13s formed in the vicinity of the end portions of the bonding layer 30, the first substrate 11 is isolated from the first layer to be separated 13 together with the first separation layer 12 (see FIG. 5(C)).

Through this step, the first remaining portion 90a is obtained from the processed member 90. Specifically, the first remaining portion 90a includes the first layer to be separated 13; the bonding layer 30 including one surface in contact with the first layer to be separated 13; the second layer to be separated 23 including one surface in contact with the other surface of the bonding layer 30; the second separation layer 22 one surface in contact with the other surface of the second layer to be separated 23; and the second substrate 21 on the second separation layer 22.

Then, the first cleaning device 350 wipes the sealant 30a that is squeezed out and remains on the periphery of the first remaining portion 90a with the wiping means of one embodiment of the present invention. As a result, the raised portion 31a shown in FIG. 5(D-1) is eliminated.

<<Third Step>>

The conveying means 111 conveys the first remaining portion 90a, and the support body feeding unit 500 feeds the first support body 41.

Then, the first bonding unit 400 forms the first adhesive layer 31 on the fed first remaining portion 90a (see FIG. 5(D-1), (D-2)) and bonds the first remaining portion 90a to the first support body 41 with the use of the first adhesive layer 31.

Through this step, the stack 91 is obtained from the first remaining portion 90a. Specifically, the stack 91 includes the first support body 41, the first adhesive layer 31, the first layer to be separated 13, the bonding layer 30 including one surface in contact with the first layer to be separated 13, the second layer to be separated 23 including one surface in contact with the other surface of the bonding layer 30, the second separation layer 22 including one surface in contact with the other surface of the second layer to be separated 23, and the second substrate 21 on the second separation layer 22 (see FIG. 5(E-1), (E-2)).

<<Fourth Step>>

The conveying means 111 conveys the stack 91, and the stack 91 is fed to the first feeding unit 100 also serving as a first unloader unit.

Through this step, the stack 91 can be unloaded. For example, when it takes time to cure the first adhesive layer 31, it is possible to unload the stack 91 in which the first adhesive layer is not cured yet and cure the first adhesive layer 31 outside the stack manufacturing apparatus 1000. Thus, occupancy time of the apparatus can be reduced.

<<Fifth Step>>

The stack 91 is loaded into the second feeding unit 600. The second feeding unit 600 feeds the stack 91, and the conveying means 112 conveys and feeds the stack 91 to the starting point formation unit 700.

<<Sixth Step>>

The starting point formation unit 700 forms the second separation starting point 91s by separation, from the second separation layer 22, part of the second layer to be separated 23 in the vicinity of the end portions of the first adhesive layer 31 of the stack 91.

For example, the first support body 41 and the first adhesive layer 31 are cut from a side where the first support body 41 is provided, and the second layer to be separated 23 is partly separated from the second separation layer 22.

Specifically, the first adhesive layer 31 and the first support body 41 in a region which is over the separation layer 22 and in which the second layer to be separated 23 is provided are cut to draw a closed curve with a blade or the like provided with a sharp tip, and along the closed curve, the second layer to be separated 23 is partly separated from the second separation layer 22 (see FIG. 6(A-1), (A-2)).

Through this step, the separation starting point 91s is formed in the vicinity of the end portions of the first support body 41b and the first adhesive layer 31 that are cut out.

<<Seventh Step>>

The second isolating unit 800 separates the second remaining portion 91a from the stack 91. Specifically, from the separation starting point formed in the vicinity of the end portions of the bonding layer 30, the second substrate 21 is isolated from the second layer to be separated 23 together with the second separation layer 22 (see FIG. 6(C)).

Through this step, the second remaining portion 91a is obtained from the stack 91. Specifically, the second remaining portion 91a includes the first support body 41b, the first adhesive layer 31, the first layer to be separated 13, the bonding layer 30 including one surface in contact with the first layer to be separated 13, and the second layer to be separated 23 including one surface in contact with the other surface of the bonding layer 30.

<<Eighth Step>>

The conveying means 112 conveys the second remaining portion 91a, and turns the second remaining portion 91a such that the second layer to be separated 23 faces upward. The second cleaning device 850 cleans the fed second remaining portion 91a using water or the like.

The conveying means 112 conveys the cleaned second remaining portion 91a to the second bonding unit 900, and the support body feeding unit 500 feeds the second support body 42. Note that the second remaining portion 91a may be directly fed to the second bonding unit 900 without being fed to the second cleaning device 850.

The second bonding unit 900 forms the second adhesive layer 32 on the fed second remaining portion 91a (see FIG. 6(D-1), (D-2)) and bonds the second remaining portion 91a to the second support body 42 with the use of the second adhesive layer 32 (see FIG. 6(E-1), (E-2)).

Through this step, the stack 92 is obtained from the second remaining portion 91a. Specifically, the stack 92 includes the first layer to be separated 13, the first support body 41b bonded to one surface of the first layer to be separated 13 with the use of the first adhesive layer 31, the bonding layer 30 including one surface in contact with the other surface of the first layer to be separated 13, the second layer to be separated 23 including one surface in contact with the other surface of the bonding layer 30, and the second support body 42 bonded to the other surface of the second layer to be separated 23 with the use of the second adhesive layer 32.

<<Ninth Step>>

The conveying means 112 conveys the stack 92, and the stack 92 is fed to the second feeding unit 600 also serving as a second unloader unit. Through this step, the stack 92 can be unloaded.

Note that this embodiment can be combined with any of the other embodiments in this specification as appropriate.

Embodiment 3

In this embodiment, a structure of a processed member that can be used for the stack manufacturing apparatus of one embodiment of the present invention is described with reference to FIG. 7.

FIG. 7 shows schematic views illustrating a structure of a processed member that can be used to form a stack with the use of the stack manufacturing apparatus of one embodiment of the present invention. FIG. 7(A-1) is a cross-sectional view illustrating a structure of the processed member 90, and FIG. 7(A-2) is a top view corresponding thereto.

<Processed Member>

The processed member 90 includes the first substrate 11, the first separation layer 12 on the first substrate 11, the first layer to be separated 13 including one surface in contact with the first separation layer 12, the bonding layer 30 including one surface in contact with the other surface of the first layer to be separated 13, the second layer to be separated 23 in contact with the other surface of the bonding layer 30, the second separation layer 22 including one surface in contact with the other surface of the second layer to be separated 23, and the second substrate 21 on the second separation layer 22 (see FIG. 7(A-1), (A-2)). Note that the separation starting points 13s may be provided in the vicinity of the end portions of the bonding layer 30.

<<First Substrate>>

There is no particular limitation on the first substrate 11 as long as the first substrate 11 has heat resistance high enough to withstand a manufacturing process and a thickness and a size which can be used in a manufacturing apparatus. As a material that can be used for the first substrate 11, glass, a ceramic, a metal, an inorganic material, resin, or the like can be given, for example.

Specifically, as the glass, non-alkali glass, soda-lime glass, potash glass, crystal glass, or the like can be given. As the metal, SUS, aluminum, and the like can be given.

The first substrate 11 may have a single-layer structure, a stacked-layer structure, or the like. For example, a structure in which a base and an insulating layer that prevents diffusion of impurities contained in the base are stacked may be employed. Specifically, a structure can be employed in which glass and various base layers that prevent diffusion of impurities contained in the glass, such as a silicon oxide layer, a silicon nitride layer, and a silicon oxynitride layer, are stacked.

<<First Separation Layer>>

There is no particular limitation on the first separation layer 12 as long as the first separation layer 12 achieves separation of the first layer to be separated 13 formed on the first separation layer 12 and has heat resistance high enough to withstand the manufacturing process. As a material that can be used for the first separation layer 12, an inorganic material, an organic resin, or the like can be given.

Specifically, as the inorganic material, a metal containing an element selected from tungsten, molybdenum, titanium, tantalum, niobium, nickel, cobalt, zirconium, zinc, ruthenium, rhodium, palladium, osmium, iridium, and silicon, an alloy containing the element, a compound containing the element, and the like can be given.

Specifically, as the organic resin, polyimide, polyester, polyolefin, polyamide, polycarbonate, an acrylic resin, or the like can be given.

The structure that can be used for the first separation layer 12 may have a single-layer structure, a stacked-layer structure, or the like. For example, a stacked-layer structure including a layer containing tungsten and a layer containing an oxide of tungsten can be employed.

The layer containing an oxide of tungsten may be a layer formed by a method in which another layer is stacked with a layer containing tungsten; for example, the layer containing an oxide of tungsten may be formed by stacking a film containing oxygen, such as silicon oxide or silicon oxynitride, with a layer containing tungsten.

The layer containing an oxide of tungsten may be formed by performing thermal oxidation treatment, oxygen plasma treatment, nitrous oxide ($N_2O$) plasma treatment, treatment with a solution having strong oxidizing power such as ozone water, or the like on a surface of a layer containing tungsten.

<<First Layer to be Separated>>

There is no particular limitation on the first layer to be separated 13 as long as the first layer to be separated 13 can be separated from the first separation layer 12 and has heat resistance high enough to withstand the manufacturing process.

As a material that can be used for the first layer to be separated 13, an inorganic material, an organic resin, or the like can be given.

The first layer to be separated 13 may have a single-layer structure, a stacked-layer structure, or the like. For example, a structure may be included in which a functional layer overlapping with the first separation layer 12 and an insulating layer that is provided between the first separation layer 12 and the functional layer to prevent diffusion of impurities which impair the characteristics of the functional layer are stacked. Specifically, a structure can be employed in which a silicon oxynitride layer, a silicon nitride layer, and the functional layer are sequentially stacked from the first separation layer 12 side.

As the functional layer that can be used for the first layer to be separated 13, a functional circuit, a functional element, an optical element, a functional film, or the like, or a layer including two or more selected from these can be given. Specifically, a pixel circuit of a display device, a driver circuit of a pixel, a display element, a color filter, a moisture-resistant film, or the like that is publicly known, or a layer including two or more selected from these can be given.

<<Bonding Layer>>

There is no particular limitation on the bonding layer 30 as long as the bonding layer 30 bonds the first layer to be separated 13 and the second layer to be separated 23 to each other. As a material that can be used for the bonding layer 30, an inorganic material, an organic resin, or the like can be given.

Specifically, a glass layer with a melting point of 400° C. or lower, preferably 300° C. or lower, an adhesive, or the like can be used.

As the sealant that can be used for the bonding layer 30, a photocurable adhesive such as a UV curable adhesive, a reactive curable adhesive, a thermosetting adhesive, an anaerobic adhesive, and the like can be given.

Examples thereof include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin.

<<Separation Starting Point>>

In the processed member 90, the separation starting points 13s may be provided in the vicinity of the end portions of the bonding layer 30. The separation starting points 13s have a structure where part of the first layer to be separated 13 is separated from the first separation layer 12.

The separation starting points 13s can be formed by inserting a sharp tip into the first layer to be separated 13 from the first substrate 11 side or by separating part of the first layer to be separated 13 from the first separation layer 12 by a noncontact method using a laser or the like (e.g., a laser ablation method).

<<Second Substrate>>

As the second substrate 21, the same substrate as the first substrate 11 can be used. Note that the second substrate 21 and the first substrate 11 do not need to have the same structure.

<<Second Separation Layer>>

As the second separation layer 22, the same layer as the first separation layer 12 can be used. Note that the second separation layer 22 and the first separation layer 12 do not need to have the same structure.

<<Second Layer to be Separated>>

As the second layer to be separated 23, the same structure as the first layer to be separated 13 can be used. Alternatively, the second layer to be separated 23 can have a structure different from that of the first layer to be separated 13. For example, a structure may be employed in which the first layer to be separated 13 includes a functional circuit and the second layer to be separated 23 includes a functional layer that prevents diffusion of impurities into the functional circuit.

Specifically, a structure may be employed in which the first layer to be separated 13 includes a pixel circuit of a display device, a driver circuit of a pixel circuit, and a light-emitting element that is connected to the pixel circuit and emits light to the second layer to be separated 23, and the second layer to be separated 23 includes a color filter and a moisture-resistant film.

Note that this embodiment can be combined with any of the other embodiments in this specification as appropriate.

REFERENCE NUMERALS 11 first substrate
12 first separation layer
13 first layer to be separated
13s starting point
21 second substrate
22 second separation layer
23 second layer to be separated
30 bonding layer
30a sealant
31 first adhesive layer
31a raised portion
32 second adhesive layer
41 first support body
41b first support body
42 second support body
90 processed member
90a first remaining portion 90b surface
91 stack
91a second remaining portion
91b surface
91s starting point
92 stack
100 first feeding unit
111 conveying means
112 conveying means
200 wiping device
210 wiping means
211 link portion
212 joint portion
213 power portion
215 wiping portion
216 main body portion
216a step portion
217 open and close nail
218 folded member
218a hollow portion
220 sheet-like member
230 stage
240 wiping cloth storage container
241 wiping cloth
250 wiping cloth disposal container
260 solvent container
261 solvent
270 excess solvent removal container
271 wire mesh
280 wiping cloth extraction means
281 suction member
290 wiping cloth mount
291 U-like-shaped opening
300 first isolating unit
300b first storage portion
350 first cleaning device
400 first bonding unit
500 support body feeding unit
600 second feeding unit
700 starting point formation unit
800 second isolating unit
800b second storage portion
850 second cleaning device
900 second bonding unit
1000 stack manufacturing device

The invention claimed is:

1. A wiping device comprising:
a stage that supports a sheet-like member;
wiping means that wipes an adhering object adhering on a peripheral portion of the sheet-like member;
a wiping cloth that is attachably and detachably provided for the wiping means; and
a solvent that adheres to the wiping cloth,
wherein the wiping means is provided with the wiping cloth, makes the solvent adhere to the wiping cloth, and wipes the adhering object, and
wherein the wiping means straddles a region where the adhering object adheres from an inside to an outside and is inclined such that an inner side precedes an outer side.

2. The wiping device according to claim 1,
wherein, in the wiping means, the wiping cloth is replaced after wiping a predetermined region in a region where the adhering object adheres.

3. The wiping device according to claim 2,
wherein the wiping means wipes the predetermined region with the same wiping surface of the wiping cloth.

4. The wiping device according to claim 2,
wherein the wiping means wipes the predetermined region with the same wiping surface of the wiping cloth and wipes another predetermined region with another wiping surface of the wiping cloth.

5. The wiping device according to claim 4,
wherein the wiping surfaces are surfaces on a right side and a left side of the wiping cloth.

6. The wiping device according to claim 4,
wherein the wiping surfaces are a surface on a front side and a right side of the wiping cloth, a surface on the front side and a left side thereof, a surface on a back side and the right side thereof, and a surface on the back side and the left side thereof.

7. The wiping device according to claim 1,
wherein excess solvent removal means is included, and
wherein an excess amount of the solvent is removed by the excess solvent removal means of the wiping means.

8. A wiping device comprising:
a stage that supports a sheet-like member;
wiping means that wipes an adhering object adhering on a peripheral portion of the sheet-like member;
a wiping cloth that is attachably and detachably provided for the wiping means; and
a solvent that adheres to the wiping cloth,
wherein the wiping means straddles the region where the adhering object adheres from an inside to an outside and is inclined such that an inner side precedes an outer side,
wherein the wiping means is provided with the wiping cloth, makes the solvent adhere to the wiping cloth, and wipes the adhering object,
wherein, in the wiping means, the wiping cloth is replaced after wiping a predetermined region in a region where the adhering object adheres, and
wherein wiping surfaces are surfaces on a right side and a left side of the wiping cloth.

9. The wiping device according to claim 8,
wherein the wiping means wipes the predetermined region with the same wiping surface of the wiping cloth.

10. The wiping device according to claim 8,
wherein the wiping means wipes the predetermined region with the same wiping surface of the wiping cloth and wipes another predetermined region with another wiping surface of the wiping cloth.

11. The wiping device according to claim 8,
wherein excess solvent removal means is included, and
wherein an excess amount of the solvent is removed by the excess solvent removal means of the wiping means.

12. A wiping device comprising:
wiping means that wipes an adhering object adhering on a peripheral portion of a sheet-like member,
wherein a wiping cloth is attachable to the wiping means, and
wherein the wiping means straddles a region where the adhering object adheres from an inside to an outside and is inclined such that an inner side precedes an outer side.

* * * * *